United States Patent
Yamada et al.

(10) Patent No.: US 6,831,020 B2
(45) Date of Patent: Dec. 14, 2004

(54) METHOD FOR FABRICATING SEMICONDUCTOR DEVICE

(75) Inventors: Takayuki Yamada, Osaka (JP); Hiroaki Nakaoka, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 75 days.

(21) Appl. No.: 10/285,660

(22) Filed: Nov. 1, 2002

(65) Prior Publication Data

US 2003/0109097 A1 Jun. 12, 2003

(30) Foreign Application Priority Data

Nov. 5, 2001 (JP) .................................... 2001-338982

(51) Int. Cl.[7] ...................... H01L 21/31; H01L 21/469
(52) U.S. Cl. ...................... 438/770; 438/761; 438/762; 438/279
(58) Field of Search .......................... 438/770, 761, 438/762, 279

(56) References Cited

U.S. PATENT DOCUMENTS

| | | | | |
|---|---|---|---|---|
| 5,863,819 A | * | 1/1999 | Gonzalez | 438/238 |
| 6,063,670 A | * | 5/2000 | Lin et al. | 438/275 |
| 2004/0023459 A1 | * | 2/2004 | Masuoka | 438/275 |

FOREIGN PATENT DOCUMENTS

JP  01-168054  7/1989

OTHER PUBLICATIONS

A. Ono et al., "A Multi-gate Dielectric Technology Using Hydrogen Pre-treatment for 100mm generation System-on-a-Chip", Symposium on VLSI Technology, 2001.

* cited by examiner

*Primary Examiner*—Caridad Everhart
(74) *Attorney, Agent, or Firm*—McDermott Will & Emery LLP

(57) ABSTRACT

After a first gate insulating film is formed on each of first to third active regions, the first gate insulating film on the second active region is removed therefrom and a second gate insulating film thinner than the first gate insulating film is formed on the second active region. Then, the first gate insulating film on the third active region is removed therefrom and a third gate insulating film thinner than the second gate insulating film is formed on the third active region. Otherwise, a pad oxide film on the first active region is removed therefrom and the first gate insulating film is formed on the first active region. Then, the pad oxide film on the second active region is removed therefrom and a second gate insulating film thinner than the first gate insulating film is formed on the second active region. Thereafter, the pad oxide film on the third active region is removed therefrom and a third gate insulating film thinner than the second gate insulating film is formed on the third active region.

16 Claims, 16 Drawing Sheets

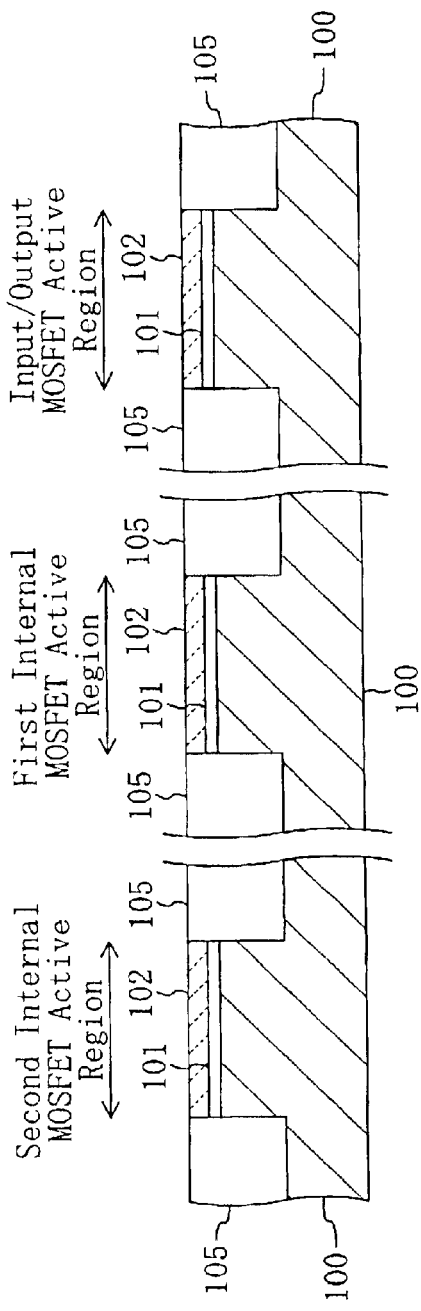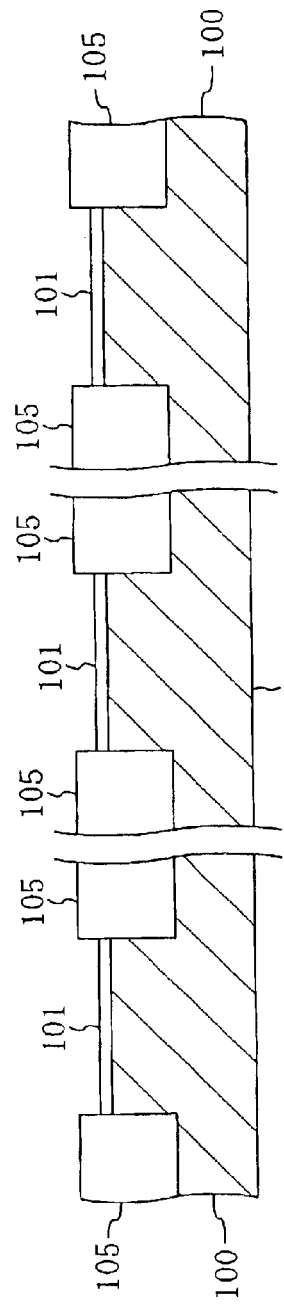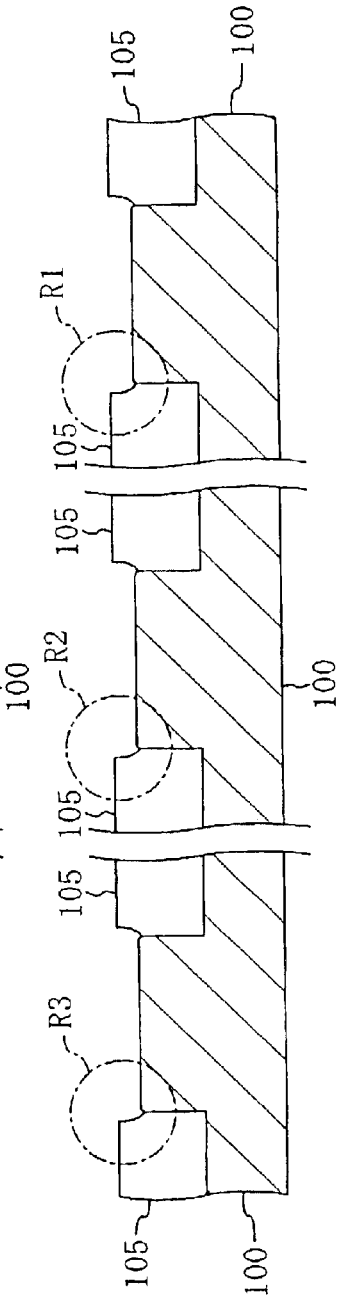
FIG. 2A
FIG. 2B
FIG. 2C

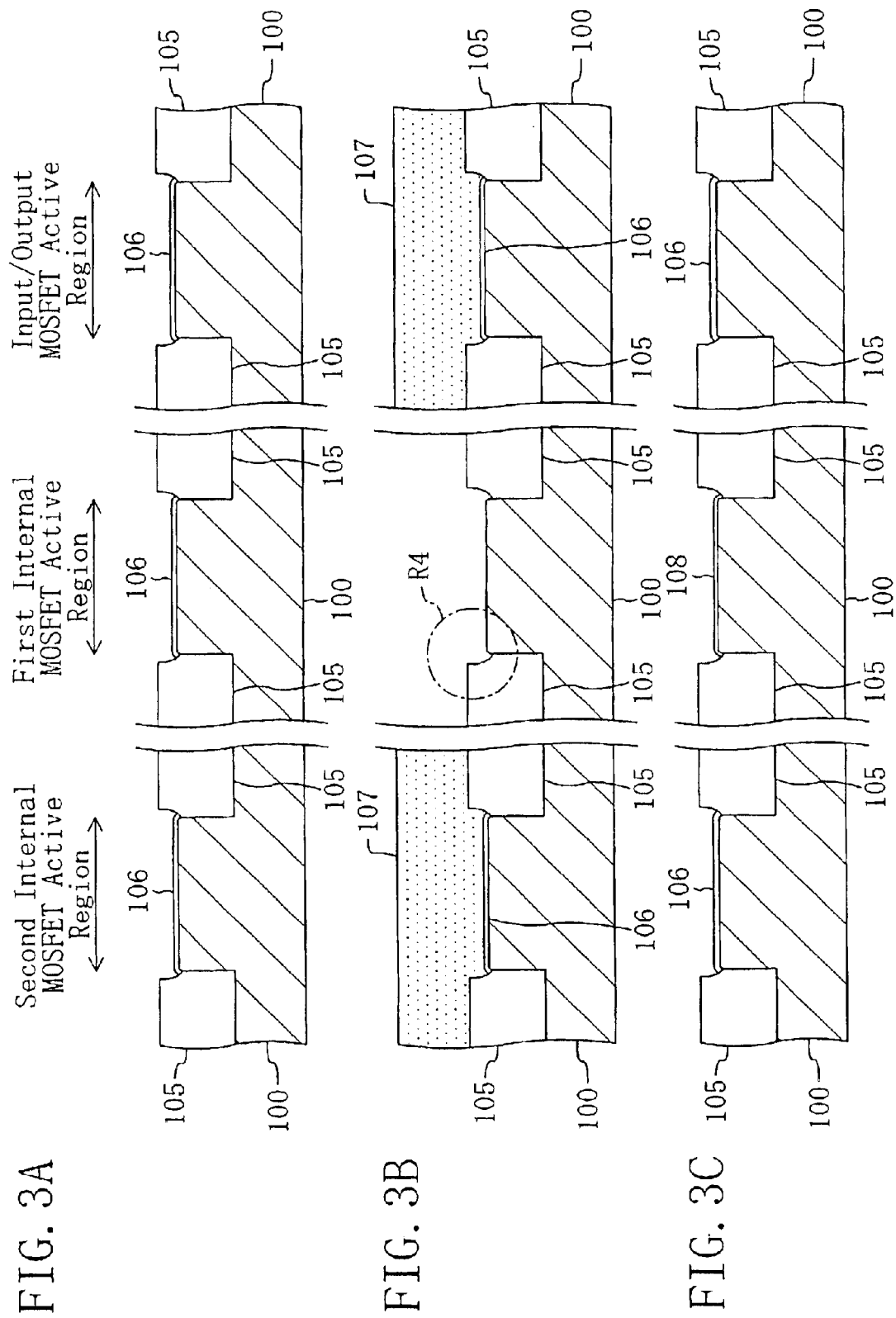

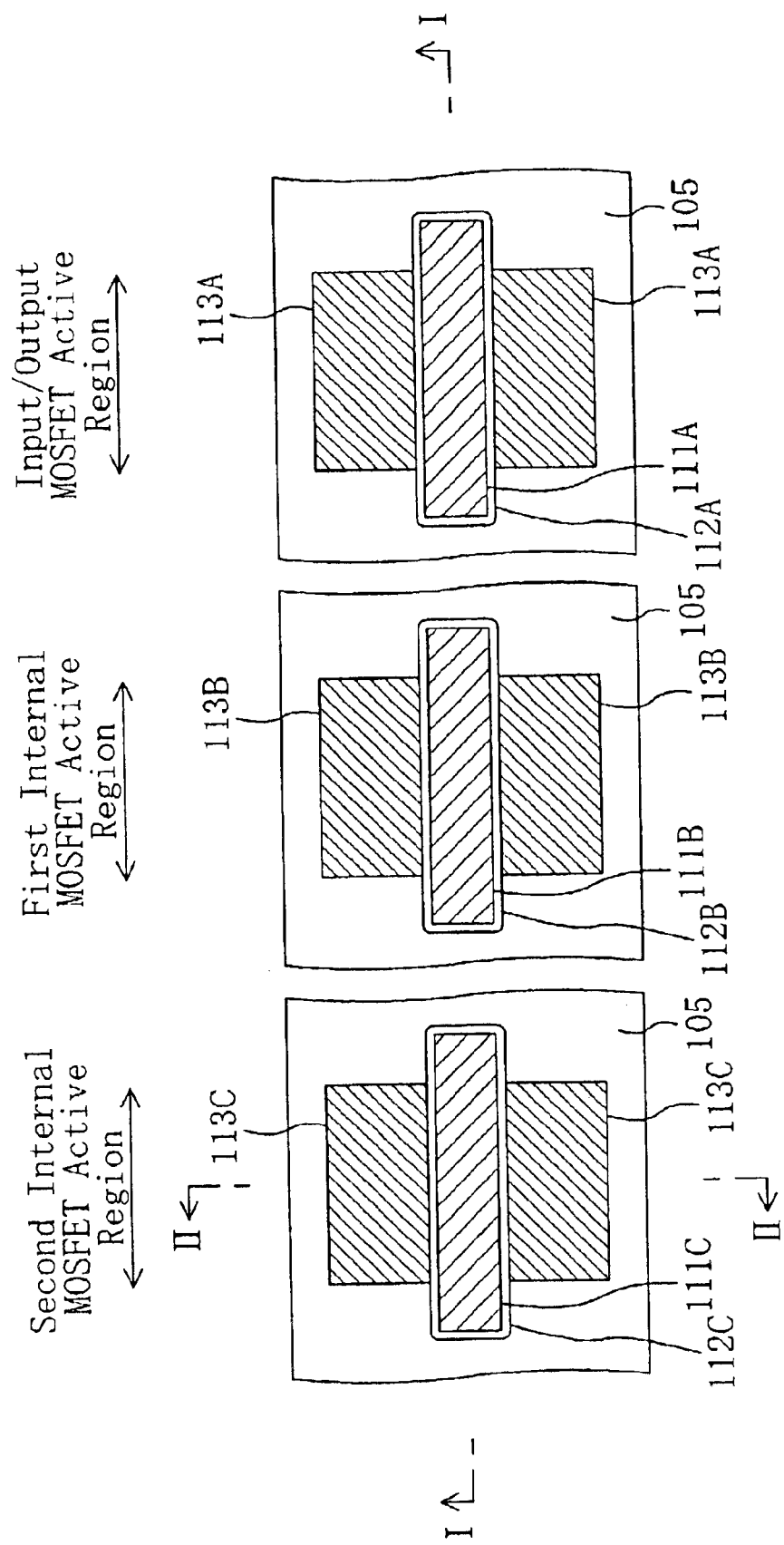

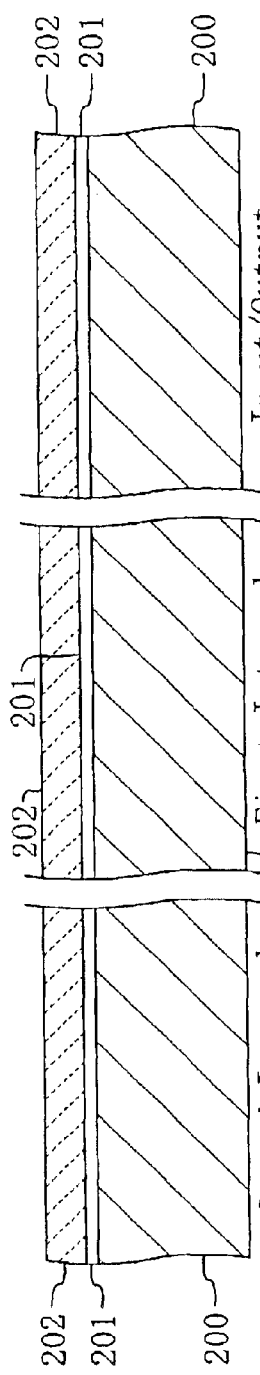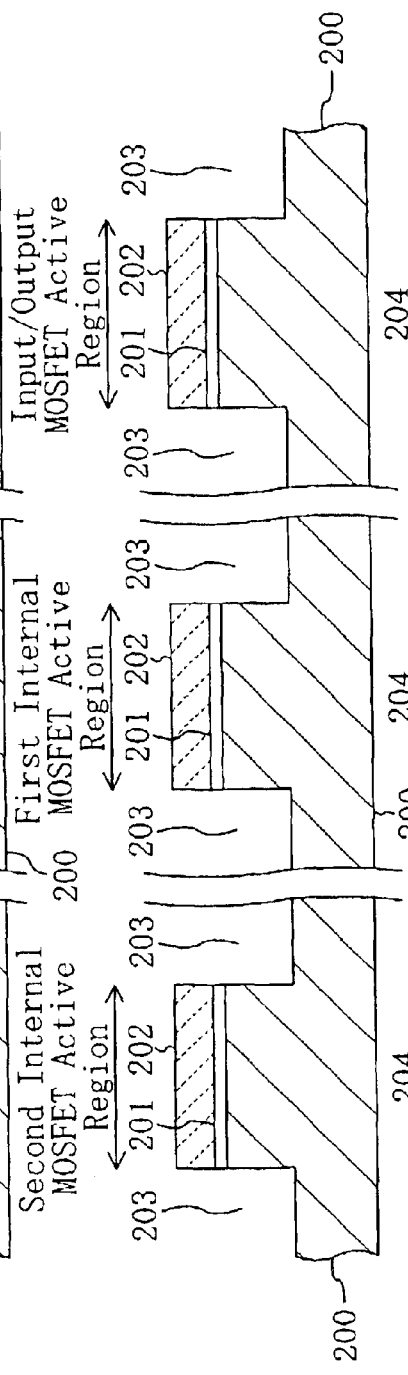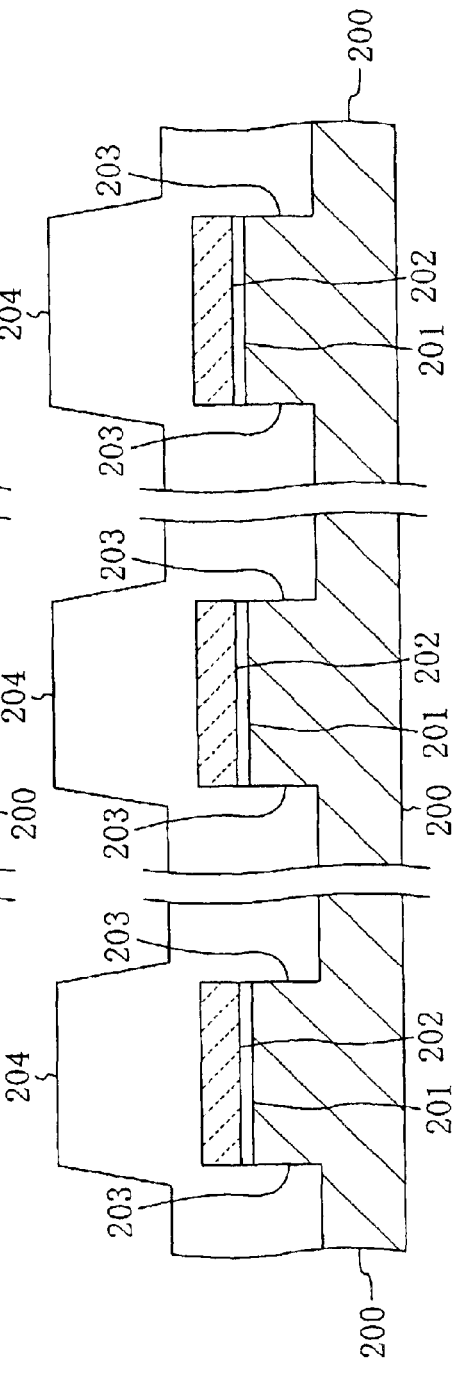

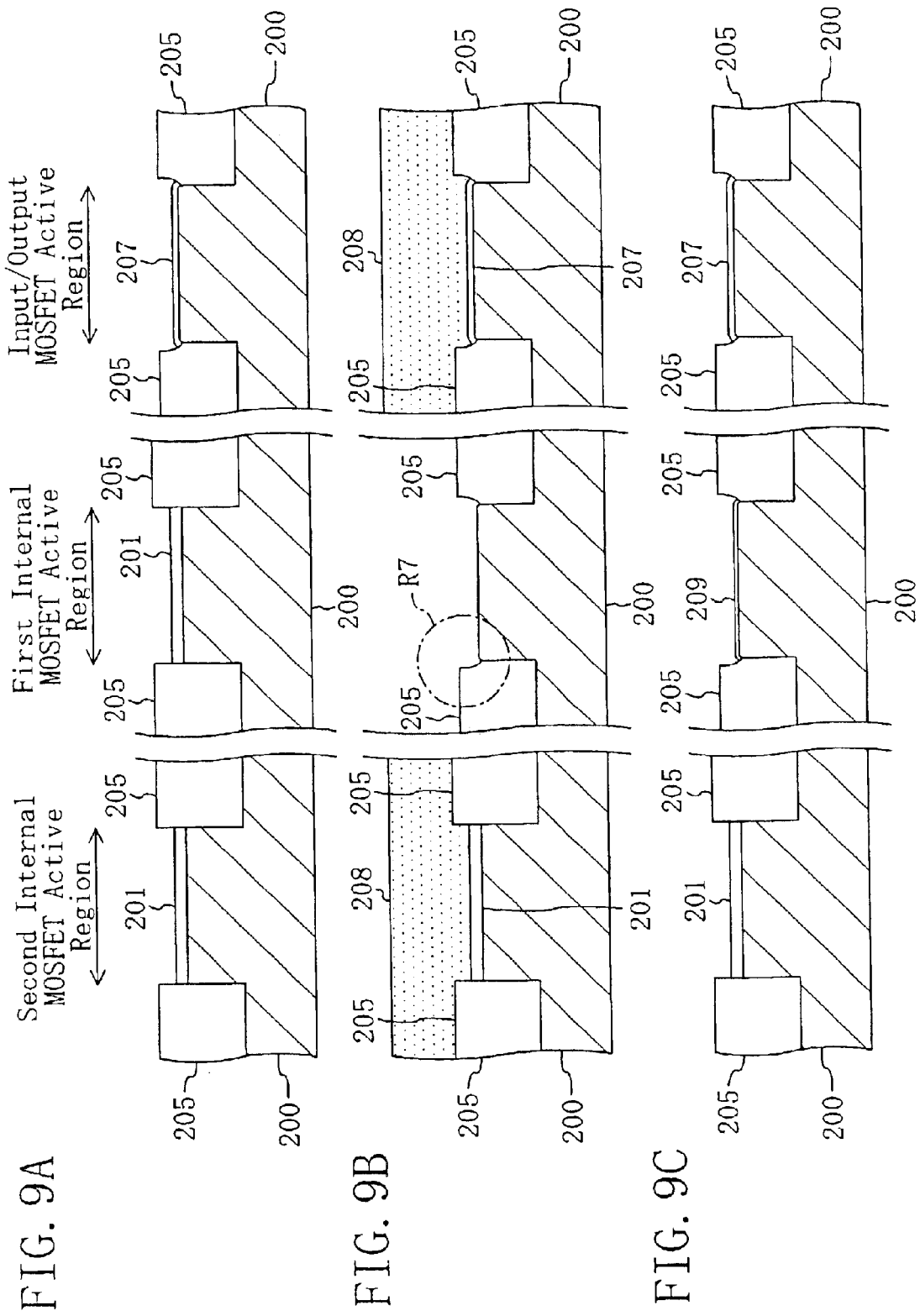

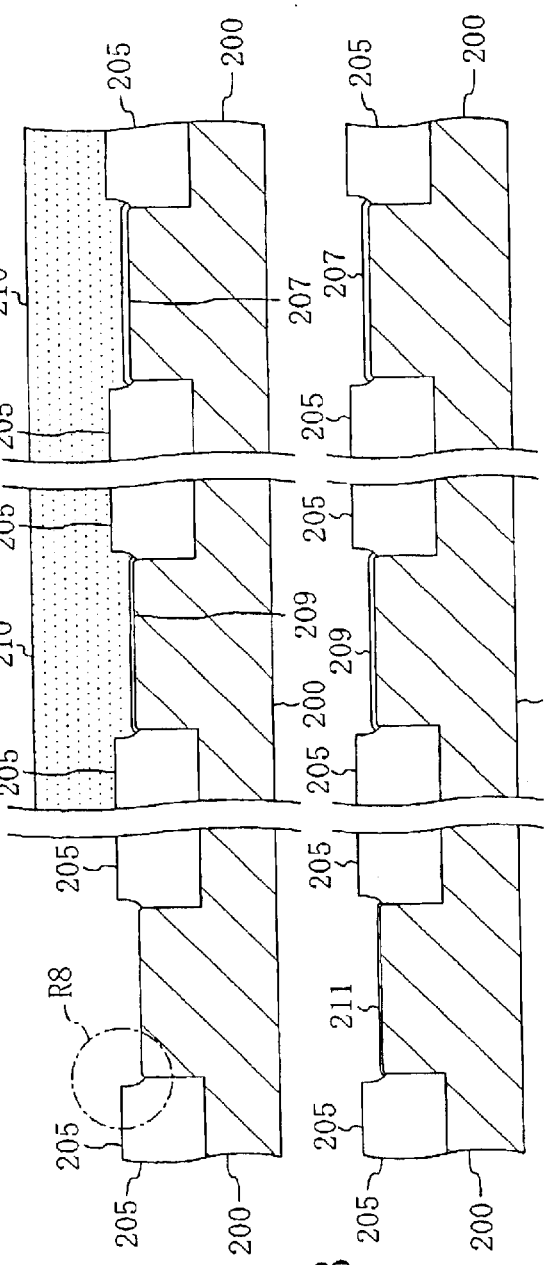
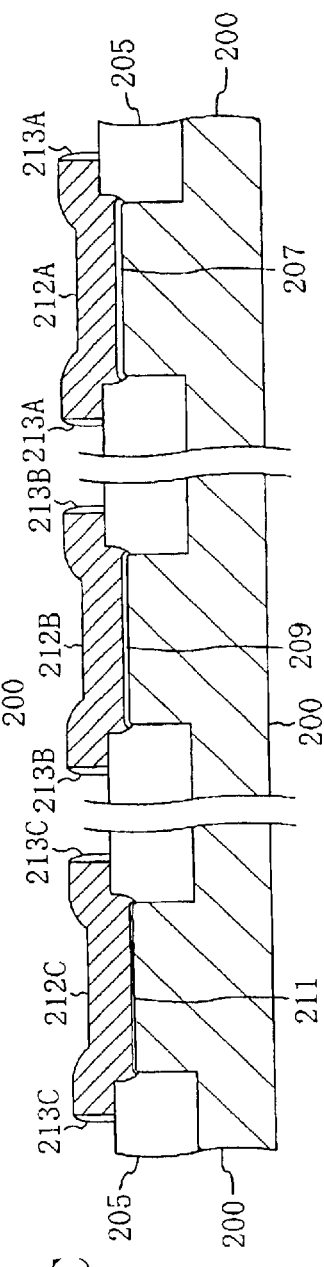
FIG. 10A
FIG. 10B
FIG. 10C

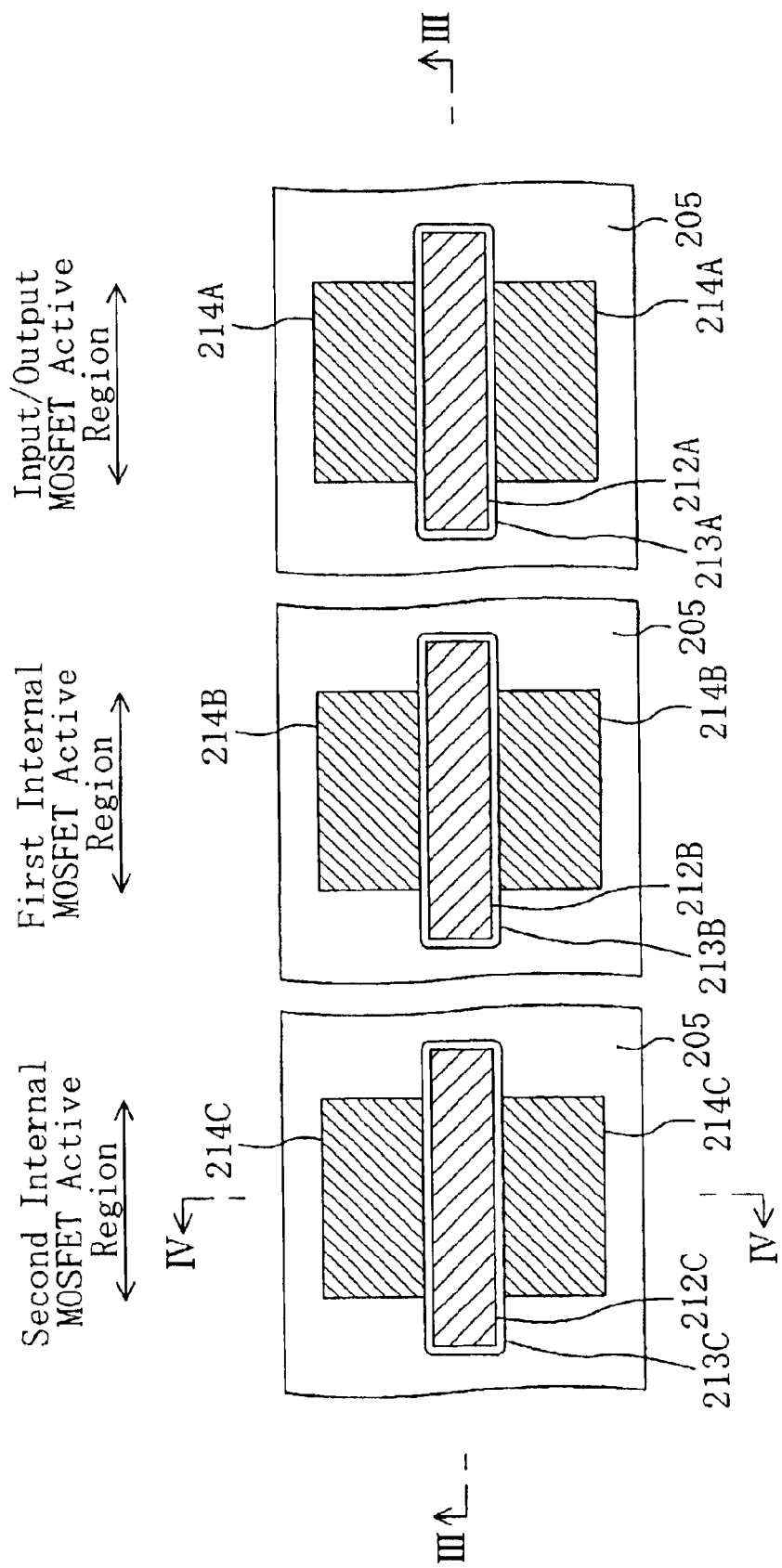

Second Internal  First Internal   Input/Output
MOSFET Active   MOSFET Active    MOSFET Active
    Region         Region            Region

METHOD FOR FABRICATING SEMICONDUCTOR DEVICE

BACKGROUND OF THE INVENTION

The present invention relates to a method for fabricating a MOS semiconductor device having three types of gate insulating films of different thicknesses.

Conventionally, a process in which two types of gate insulating films having different thicknesses are formed selectively on one chip has been used commonly for a MOS semiconductor device. In the generation of 0.18-$\mu$m design rules, e.g., a MOSFET having a thin-film gate insulating film with a thickness of about 3.5 nm has been provided for an internal circuit operating at 1.8 V, while a MOSFET having a thick-film gate insulating film with a thickness of about 8 nm has been provided for an input/output circuit operating at 3.3 V (see pp.2-3 and FIGS. 1A to 1H of Japanese Laid-Open Patent Publication No. HEI 1-168054).

FIGS. 13A to 13C are cross-sectional views illustrating the individual process steps of a method for fabricating a semiconductor device according to a first conventional embodiment, specifically a method for fabricating a MOS semiconductor device having two types of gate insulating film having different thicknesses.

First, as shown in FIG. 13A, a heat treatment is performed in an oxidizing atmosphere with respect to a silicon substrate 10 having the active region of the MOSFET for the internal circuit (hereinafter referred to as the internal MOSFET active region) and the active region of the MOSFET for the input/output circuit (hereinafter referred to as the input/output MOSFET active region). As a result, a surface of the silicon substrate 10 is thermally oxidized so that a first gate insulating film 11 having a thickness of about 6 nm is formed on each of the internal MOSFET active region and the input/output MOSFET active region.

Next, as shown in FIG. 13B, wet etching using a solution containing a hydrofluoric acid is performed with respect to the first gate oxide film 11 by using a resist pattern 12 covering the input/output MOSFET active region as a mask, thereby removing the first gate oxide film 11 on the internal MOSFET active region therefrom. This exposes the substrate surface in the internal MOSFET active region.

After the resist pattern 12 is then removed, a heat treatment is performed in an oxidizing atmosphere with respect to the silicon substrate 10, as shown in FIG. 13C. Since the first gate oxide film 11 has been formed on the input/output MOSFET active region, the substrate surface in the internal MOSFET active region is thermally oxidized. This allows a second gate oxide film 13 having a thickness of about 3.5 nm to be formed on the internal MOSFET active region. On the other hand, the first gate oxide film 11 is increased in thickness to about 8 nm. Accordingly, the second gate oxide film 13 is thinner than the first gate oxide film 11 that has been increased in thickness.

Thereafter, a gate electrode, source/drain electrodes, an interlayer insulating film, metal wiring, and the like are formed by using well-known techniques, though they are not depicted, whereby the fabrication of the semiconductor device comprising the input/output MOSFET having the relatively thick first gate oxide film 11 and the internal MOSFET having the relatively thin second gate oxide film 13 is completed.

As the gate insulating film of the internal circuit is reduced in thickness with the miniaturization of the MOSFET, however, the power consumption of the internal circuit of the first conventional embodiment tends to increase due to an increased gate leakage current. Consequently, it has become difficult to enhance the performance of a MOS semiconductor device represented by a system LSI, while reducing both of the size (increasing the degree of integration) and power consumption thereof.

To reduce both of the size and power consumption of the internal circuit, there has been examined a method of constituting the internal circuit by two MOSFETs, one of which is a MOSFET wherein an enhanced driving ability achieved by a reduction in the thickness of the gate insulating film is a higher priority and the other of which is a MOSFET wherein reduced power consumption is a higher priority, and selectively using the two MOSFETs depending on an object or a use. In suppressing an increase in power consumption resulting from a gate leakage current, it is most effective to increase the thickness of the gate insulating film. It becomes therefore necessary to individually form two types of gate insulating films having different thicknesses. In the generation of 0.10-$\mu$m design rules, e.g., size reduction and lower power consumption can be achieved by using a thin-film gate insulating film with a thickness of 1.6 nm and a thick-film gate insulating film with a thickness of 2.4 nm as the gate insulating films of a MOSFET composing an internal circuit operating at 1.0 to 1.2 V. On the other hand, an input/output circuit required to operate at a high voltage of 3.3 V, 2.5 V, or the like needs a MOSFET having a gate insulating film with a thickness of about 8 nm. Thus, it has become necessary to individually form the total of three gate insulating films having different thicknesses for the internal circuit and the input/output circuit in one chip.

To implement the three types of gate insulating films formed individually, there has been proposed a method for fabricating a semiconductor device using three thermal oxidation steps (see pp. 79–80 (especially FIG. 2) of A. Ono et al., A Multi-gate Dielectric Technology Using Hydrogen Pre-treatment for 100 nm generation System-on-a-Chip, 2001 Symposium on VLSI Technology Digest of Technical Papers).

FIGS. 14A to 14C and FIGS. 15A to 15C are cross-sectional views illustrating the individual process steps of a method for fabricating a semiconductor device according to a second conventional embodiment, specifically a method for fabricating a MOS semiconductor device having three types of gate insulating films of different thicknesses.

First, as shown in FIG. 14A, an isolating region (not shown) is formed in silicon substrate 20 by LOCOS or the like so as to partition the silicon substrate 20 into an input/output MOSFET active region, a first internal MOSFET active region, and a second internal MOSFET active region. Then a mask nitride film and a pad oxide film (each of which is not shown) used for the formation of the isolation region are removed by wet etching, whereby a substrate surface in each of the MOSFET active regions is exposed.

Next, as shown in FIG. 14B, a heat treatment is performed in an oxidizing atmosphere with respect to the silicon substrate 20 having the input/output MOSFET active region, the first internal MOSFET active region to be provided with a thick-film gate insulating film, and the second internal MOSFET active region to be provided with a thin-film gate insulating film. This thermally oxidizes a surface of the silicon substrate 20 and thereby allows a first gate oxide film 21 to be formed individually on each of the input/output MOSFET active region, the first internal MOSFET active region, and the second internal OSFET active region.

Next, as shown in FIG. 14C, wet etching using a solution containing a hydrofluoric acid is performed with respect to the first gate oxide film 21 by using, as a mask, a first resist pattern 22 covering the input/output MOSFET active region, thereby removing the first gate oxide film 21 on each of the first and second internal MOSFET active regions therefrom and exposing the substrate surface in each of the first and second internal MOSFET active regions.

After the first resist pattern 22 is then removed, a heat treatment is performed in an oxidizing atmosphere with respect to the silicon substrate 20, as shown in FIG. 15A. Since the first gate oxide film 21 has been formed on the input/output MOSFET active region, the substrate surface in each of the first and second internal MOSFET active regions is thermally oxidized. This allows a second gate oxide film 23 to be formed individually on each of the first and second internal MOSFET active regions. At the same time, the first gate oxide film 21 is slightly increased in thickness. Accordingly, the second oxide film 23 is thinner than the first gate oxide film 21 that has been increased in thickness.

Next, as shown in FIG. 15B, wet etching using a solution containing a hydrofluoric acid is performed with respect to the second gate oxide film 23 by using, as a mask, a second resist pattern 24 covering the input/output MOSFET active region and the first internal MOSFET active region, thereby removing the second gate oxide film 23 on the second internal MOSFET active region.

After the second resist pattern 24 is then removed, a heat treatment is performed in an oxidizing atmosphere with respect to the silicon substrate 20, as shown in FIG. 15C. Since the first gate oxide film 21 has been formed on the input/output MOSFET active region and the second gate oxide film 23 has been formed on the first internal MOSFET active region is thermally oxidized. This allows a third gate oxide film 25 to be formed on the second internal MOSFET active region. At the same time, each of the first and second gate oxide films 21 and 23 is slightly increased in thickness. Accordingly, the third gate oxide film 25 is thinner than the second gate oxide film 23 that has been increased in thickness.

Thereafter, a gate electrode, source/drain electrodes, an interlayer insulating film, metal wiring, and the like are formed by using well-known techniques, though they are not depicted, whereby the fabrication of the semiconductor device comprising an input/output MOSFET having the relatively thickest first gate oxide film 21, a first internal MOSFET having the relatively second thickest second gate oxide film 23, and a second internal MOSFET having the relatively thinnest third gate oxide film 25 is completed.

However, the second conventional embodiment has the problems of anomalies in the characteristics of a transistor and the degradation of the reliability of a gate insulating film. A description will be given herein below to the cause for the problems with reference to the drawings. FIG. 16 shows a cross-sectional structure (in the gate width direction) of the second internal MOSFET having the thin-film gate insulating film in the semiconductor device fabricated according to the second conventional embodiment. As shown in FIG. 16, a gate electrode 27 is formed on the second internal MOSFET active region (silicon substrate 20) surrounded by an isolation region 26 with the third gate oxide film 25 (see FIG. 15C) interposed therebetween. In addition, insulating sidewalls 28 are formed on the side surfaces of the third gate oxide film 25.

In the second conventional embodiment, the substrate surface in the first internal MOSFET active region on which the thick-film gate insulating film is to be provided is exposed twice by wet etching. On the other hand, the substrate surface in the second internal MOSFET active region on which the thin-film gate insulating film is to be provided is exposed three times by wet etching. Accordingly, the roughness of the substrate surface is more conspicuous in the second internal MOSFET active region than in the first internal MOSFET active region. Moreover, the portion of the isolation region 26 which is adjacent the second internal MOSFET active region, i.e., the end portion of the isolation region 26 is more likely to be etched to a greater depth than the first internal MOSFET active region, as shown in FIG. 16. In the second internal MOSFET having the relatively thinnest third gate oxide film 25, therefore, due to an increased depth to which the end portion of the isolation region 26 is etched, the thickness of the third gate oxide film 25 becomes uneven and an electric field is localized to the portion of the third gate oxide film 25 which is adjacent the isolation region 26 during the application of a gate voltage. Such increased roughness of a substrate surface, an uneven thickness of a gate insulating film, or a localized electric field is the cause of the anomalies in the characteristics of a transistor or the degradation of the reliability of the gate insulating film. Further, the number of times of wet etching which differs from the first internal MOSFET to the second internal MOSFET, to each of which the gate voltage of the same magnitude is applied, also causes the problem that the setting of a process margin for each of the internal MOSFETs becomes difficult.

SUMMARY OF THE INVENTION

In view of the foregoing, it is therefore an object of the present invention to prevent anomalies in the characteristics of a transistor or the degradation of the reliability of a gate insulating film and allow easy setting of a process margin in the fabrication of a MOS semiconductor having three types of gate insulating films.

To attain the object, a first method for fabricating a semiconductor device according to the present invention comprises the steps of: forming a semiconductor substrate with a first active region, a second active region, and a third active region isolated from each other by an isolation region and then forming a first gate insulating film on each of the first, second, and third active regions; removing the first gate insulating film on the second active region therefrom and then forming a second gate insulating film thinner than the first gate insulating film on the second active region; after the step of forming the second gate insulating film, removing the first gate insulating film on the third active region therefrom and then forming a third gate insulating film thinner than the second gate insulating film on the third active region; and forming a first gate electrode, a second gate electrode, and a third gate electrode on the first, second, and third active regions with the first, second, and third gate insulating films interposed therebetween, respectively.

In contrast to the second conventional embodiment, the first method for fabricating a semiconductor device achieves the following effects.

Specifically, the number of times that the third active region is exposed by wet etching or the like performed to remove the gate insulating films can be reduced. This reduces the roughness of the substrate surface in the third active region. This also reduces the depth to which the region of the exposed portion of the trench isolation region which is adjacent the third active region, i.e., the end portion of the trench isolation region is etched so that the thickness of the third gate insulating film becomes uniform and the localization of an electric field to the portion of the third gate insulating film which is adjacent the trench isolation region during the application of a gate voltage is prevented. As a result, anomalies in the characteristics of a transistor or the degradation of the reliability of a gate insulating film resulting from increased roughness of a substrate surface, an uneven thickness of the gate insulating film, or the localization of an electric field can be prevented. Since the number of times that the third active region is exposed becomes equal to the number of times that the second active region is exposed, the setting of a process margin for each of the MOSFETs can be performed easily if a gate voltage of the same magnitude is applied to each of the respective MOSFETs formed in the second and third active regions.

In the first method for fabricating a semiconductor device, the isolation region may be a trench isolation region.

In the first method for fabricating a semiconductor device, the step of forming each of the first, second, and third gate insulating films preferably includes the step of thermally oxidizing a surface of each of the first, second, and third active regions.

This allows easy and reliable formation of each of the gate insulating films.

In the first method for fabricating a semiconductor device, the step of removing the first gate insulating film on the specified active region therefrom preferably includes the step of performing wet etching with respect to the first gate insulating film by using a resist pattern covering the active regions other than the specified active region as a mask.

This ensures the removal of the first gate insulating film on the specified active region therefrom, while protecting a surface (if a gate oxide film is formed thereon, the surface of the gate oxide film) of each of the other active regions.

A second method for fabricating a semiconductor device according to the present invention comprises the steps of: forming a semiconductor substrate with a first active region, a second active region, and a third active region separated from each other by an isolation region and each having a surface covered with a pad oxide film; removing the pad oxide film on the first active region therefrom and then forming a first gate insulating film on the first active region; after the step of forming the first gate insulating film, removing the pad oxide film on the second active region therefrom and then forming a second gate insulating film thinner than the first gate insulating film on the second active region; after the step of forming the second gate insulating film, removing the pad oxide film on the third active region therefrom and forming a third gate insulating film thinner than the second gate insulating film on the third active region; and forming a first gate electrode, a second gate electrode, and a third gate electrode on the first, second, and third active regions with the first, second, and third gate insulating films interposed therebetween, respectively.

In contrast to the second conventional embodiment, the second method for fabricating a second semiconductor device achieves the following effects.

Specifically, the number of times that each of the second and third active regions is exposed by wet etching or the like performed to remove the pad oxide film or the gate insulating film can be reduced. This reduces the roughness of the substrate surface in each of the second and third active regions. This also reduces the depth to which the region of the exposed portion of the trench isolation region which is adjacent each of the second and third active regions is etched so that the thickness of each of the second and third gate insulating film becomes uniform and the localization of an electric field to the portion of each of the second and third gate insulating films which is adjacent the trench isolation region is prevented during the application of a gate voltage. As a result, anomalies in the characteristics of a transistor or the degradation of the reliability of a gate insulating film resulting from increased roughness of a substrate surface, an uneven thickness of the gate insulating film, or the localization of an electric field can be prevented. Since the number of times that the third active region is exposed becomes equal to the number of times that the second active region is exposed, the setting of a process margin for each of the MOSFETs can be performed easily if a gate voltage of the same magnitude is applied to each of the respective MOSFETs formed in the second and third active regions.

In the second method for fabricating a semiconductor device, the isolation region may be a trench isolation region.

In the second method for fabricating a semiconductor device, each of the first and second active regions may be an active region of a MOSFET of an input/output circuit and the third active region may be an active region of a MOSFET of an internal circuit.

In the second method for fabricating a semiconductor device, the first, second, or third gate insulating film is preferably formed by thermally oxidizing a surface of the active region on which the gate insulating film is to be provided.

This allows easy and reliable formation of each of the gate insulating films.

In the second method for fabricating a semiconductor device, the step of removing the pad oxide on the specified active region therefrom preferably includes the step of performing wet etching with respect to the pad oxide film by using a resist pattern covering the active regions other than the specified active region as a mask.

This ensures the removal of the pad oxide film on the specified active region therefrom, while protecting a surface (if a gate oxide film is formed thereon, the surface of the gate oxide film) of each of the other active regions.

BRIEF DESCRIPTION OF THE DRAWINGS

FIGS. 2A to 2C are cross-sectional views illustrating the method for fabricating a semiconductor device according to the first embodiment;

FIGS. 3A to 3C are cross-sectional views illustrating the method for fabricating a semiconductor device according to the first embodiment;

FIG. 5 is a plan view corresponding to the cross-sectional view shown in FIG. 4C;

FIGS. 7A to 7C are cross-sectional views illustrating a method for fabricating a semiconductor device according to a second embodiment of the present invention;

FIGS. 9A to 9C are cross-sectional views illustrating the method for fabricating a semiconductor device according to the second embodiment;

FIGS. 10A to 10C are cross-sectional views illustrating the method for fabricating a semiconductor device according to the second embodiment;

FIG. 11 is a plan view corresponding to the cross-sectional view shown in FIG. 10C;

DETAILED DESCRIPTION OF THE INVENTION

Embodiment 1

Figure 1A:
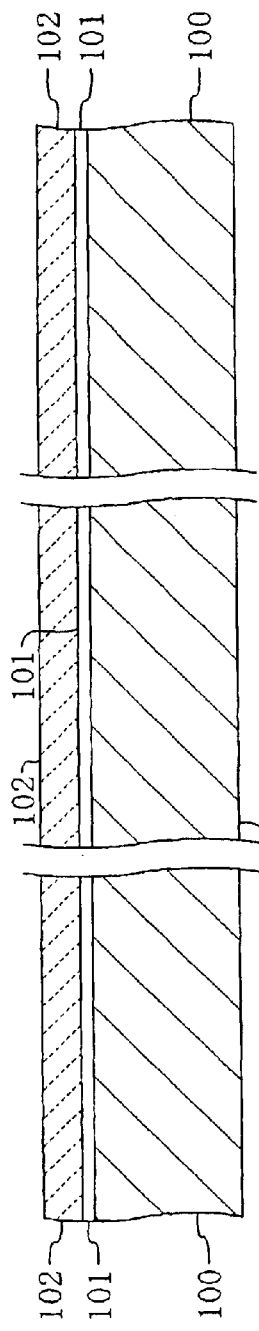
FIGS. 1A to 1C are cross-sectional views illustrating a method for fabricating a semiconductor device according to a first embodiment of the present invention.

Referring to the drawings, a description will be given to a method for fabricating a semiconductor device according to a first embodiment of the present invention, specifically a method for fabricating a MOS semiconductor device having three types of gate insulating films of different thicknesses.

FIGS. 1A to 1C, FIGS. 2A to 2C, FIGS. 3A to 3C, and FIGS. 4A to 4C are cross-sectional views illustrating the individual process steps of the method for fabricating a semiconductor device according to the first embodiment.

First, as shown in FIG. 1A, a pad oxide film 101 having a thickness of about 15 nm and a mask nitride film 102 having a thickness of about 120 nm are formed successively on a silicon substrate 100.

Figure 1B:
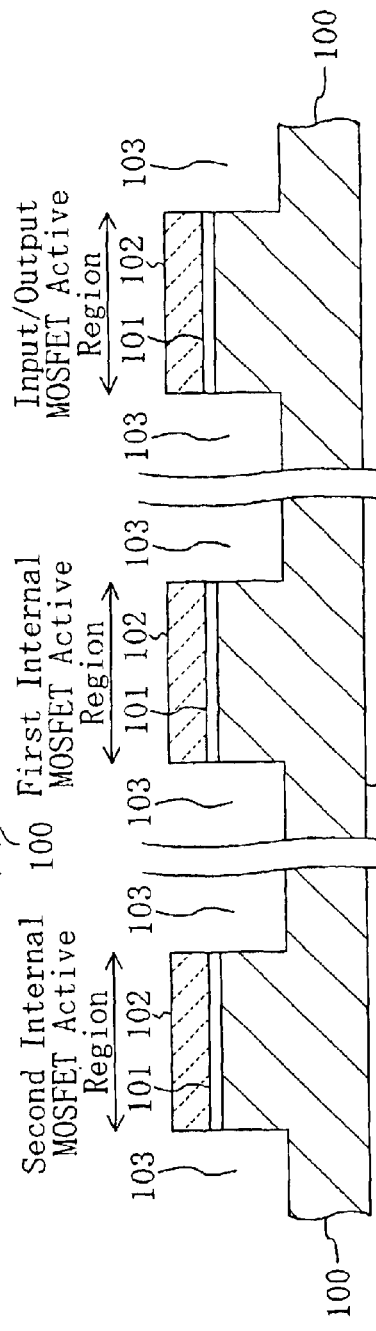

Then, as shown in FIG. 1B, an isolation trench 103 is formed by successively performing dry etching with respect to the mask nitride film 102, the pad oxide film 101, and the silicon substrate 100 by using a mask pattern (not shown) covering the respective portions of the silicon substrate 100 serving as an input/output MOSFET active region, as a first internal MOSFET active region to be provided with a thick-film gate insulating film, and as a second internal MOSFET active region to be provided with a thin-film gate insulating film, i.e., a mask pattern having openings over isolation formation regions. As a result, the silicon substrate 100 is formed with the input/output MOSFET active region, with the first internal MOSFET active region, and with the second internal MOSFET active region isolated from each other by the isolation trench 103.

Figure 1C:
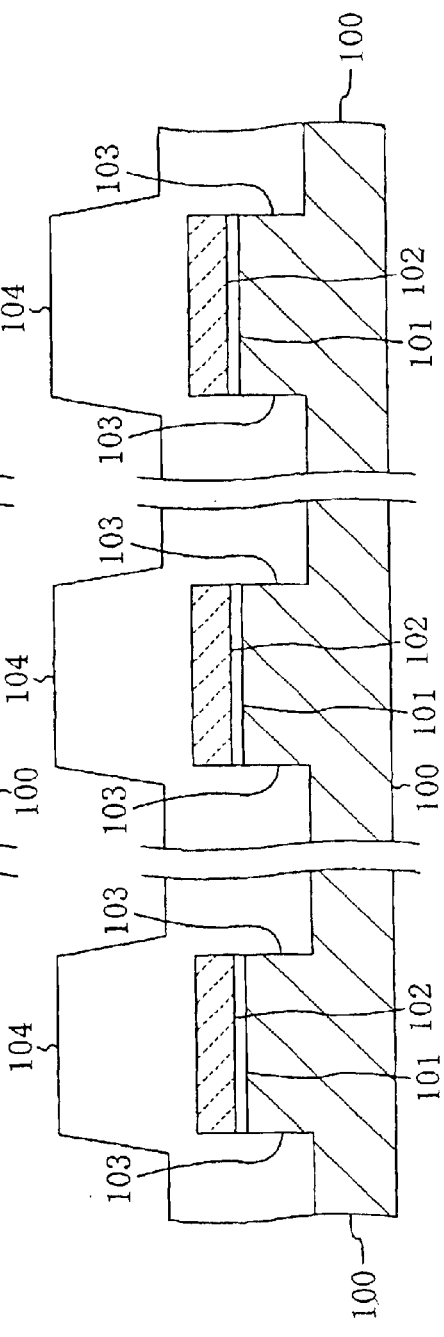

Next, as shown in FIG. 1C, a silicon dioxide film 104 is deposited over the entire surface of the silicon substrate 100 to completely fill up the isolation trench 103. Then, as shown in FIG. 2A, the silicon dioxide film 104 on the mask nitride film 102 is removed therefrom by CMP (chemical mechanical polishing) or the like, whereby a trench isolation region 105 composed of the silicon dioxide film 104 filled in the isolation trench 103 is formed, while the mask nitride film 102 on each of the MOSFET active regions is exposed. Then, as shown in FIG. 2B, the mask nitride film 102 is removed by wet etching or dry etching so that the pad oxide film 101 is exposed.

Next, as shown in FIG. 2C, wet etching using a solution containing a hydrofluoric acid is performed with respect to the pad oxide film 101, thereby removing the pad oxide film 101. As a result, the respective substrate surface in each of the MOSFET active regions is exposed. At the same time, the regions of the exposed portions of the trench isolation region 105 which are adjacent the MOSFET active regions are also removed by wet etching (see the regions R1, R2, and R3).

In the wet etching step shown in FIG. 2C, over-etching of about 50% (corresponding to the thickness of the etched film portion: 22.5 nm) is performed to ensure the removal of the pad oxide film 101.

Next, as shown in FIG. 3A, a heat treatment is performed in an oxidizing atmosphere with respect to the silicon substrate 100. This thermally oxidizes a surface of the silicon substrate 100 and thereby allows a first gate oxide film 106 having a thickness of, e.g., about 7 nm to be formed individually on each of the input/output MOSFET active region, the first internal MOSFET active region, and the second internal MOSFET active region.

Next, as shown in FIG. 3B, wet etching using a solution containing a hydrofluoric acid is performed with respect to the first gate oxide film 106 by using, as a mask, a first resist pattern 107 covering the input/output MOSFET active region and the second internal MOSFET active region, thereby removing only the first gate oxide film 106 on the first internal MOSFET active region therefrom and exposing only the substrate surface in the first internal MOSFET active region. At the same time, the region of the exposed portion of the trench isolation region 105 which is adjacent the first internal MOSFET active region is further removed by wet etching (see the region R4).

In the wet etching step shown in FIG. 3B, over-etching of about 50% (corresponding to the thickness of the etched film portion: 10.5 nm) is performed to ensure the removal of the first gate oxide film 106 on the first internal MOSFET active region.

After the first resist pattern 107 is then removed, a heat treatment is performed in an oxidizing atmosphere with respect to the silicon substrate 100, as shown in FIG. 3C. This thermally oxidizes the substrate surface in the first internal MOSFET active region with the first gate oxide film 106 being formed on each of the input/output MOSFET active region and the second internal MOSFET active region and thereby allows a second gate oxide film 108 having a thickness of, e.g., about 1.6 nm to be formed on the first internal MOSFET active region. On the other hand, the heat treatment increases the thickness of the first gate oxide film 106 to, e.g., about 7.4 nm. Accordingly, the second gate oxide film 108 is thinner than the first gate oxide film 106 that has been increased in thickness.

Figures 4A, 4B, 4C:
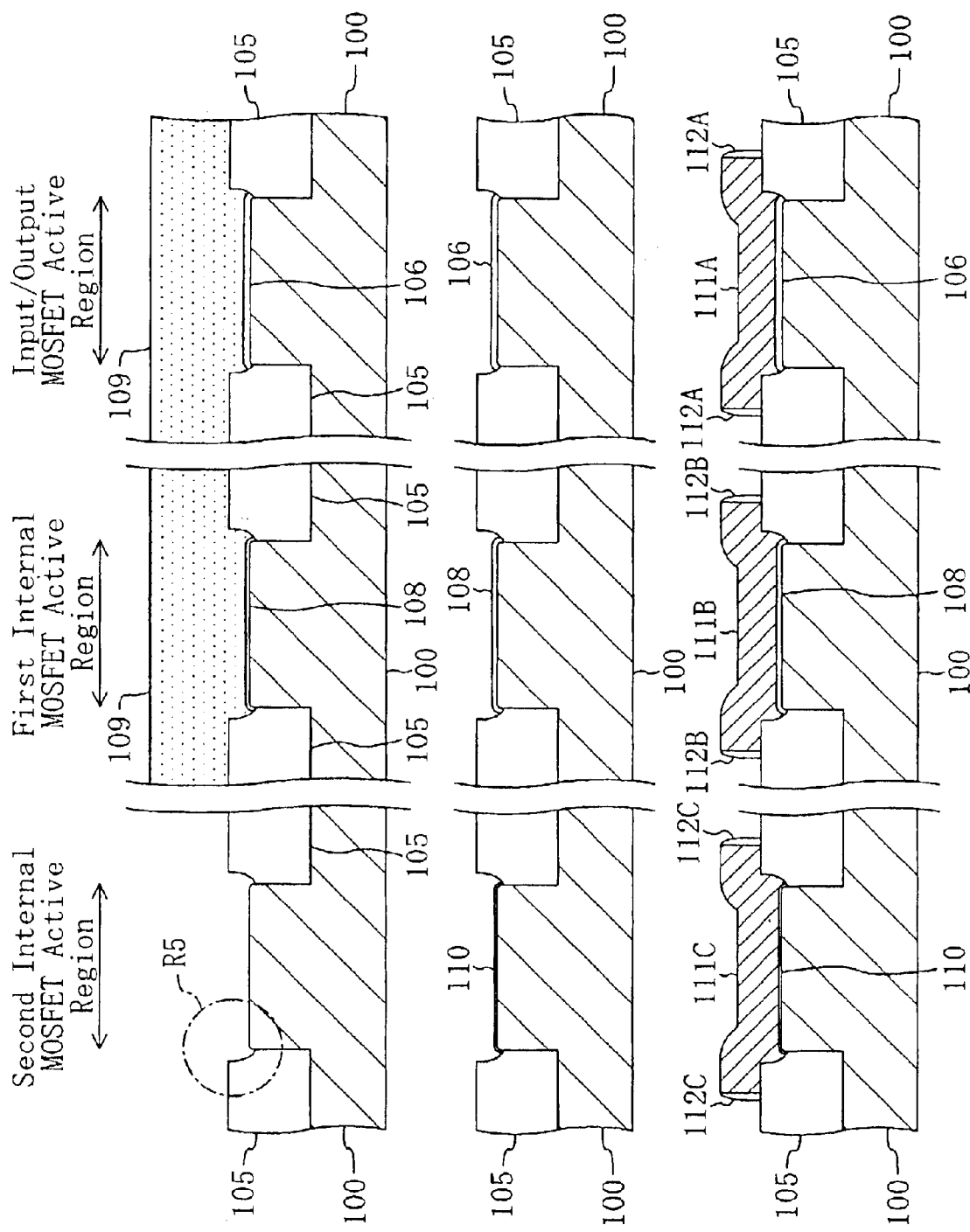
FIGS. 4A to 4C are cross-sectional views illustrating the method for fabricating a semiconductor device according to the first embodiment.

Next, as shown in FIG. 4A, wet etching using a solution containing a hydrofluoric acid is performed with respect to the first gate oxide film 106 by using, as a mask, a second resist pattern 109 covering the input/output MOSFET active region and the first internal MOSFET active region, thereby removing only the first gate oxide film 106 on the second internal MOSFET active region therefrom and exposing only the substrate surface in the second internal MOSFET active region. At the same time, the region of the exposed portion of the trench isolation region 105 which is adjacent the second internal MOSFET active region is further removed by wet etching (see the region R5).

In the wet etching step shown in FIG. 4A, over-etching of about 50% (corresponding to the thickness of the etched film portion: 11.1 nm) is performed to ensure the removal of the first gate oxide film 106 on the second internal MOSFET active region.

After the second resist pattern 109 is then removed, a heat treatment is performed in an oxidizing atmosphere with respect to the silicon substrate 100, as shown in FIG. 4B. This thermally oxidizes the substrate surface in the second internal MOSFET active region with the first gate oxide film 106 being formed on the input/output MOSET active region and with the second gate oxide film 108 being formed on the first internal MOSFET active region and thereby allows a third gate oxide film 110 having a thickness of, e.g., about 1.6 nm to be formed on the second internal MOSFET active region. On the other hand, the heat treatment increases the thickness of the first gate oxide film 106 to, e.g., about 7.8 nm, while increasing the thickness of the second gate oxide film 108 to, e.g., about 2.8 nm. Accordingly, the third gate oxide film 110 is thinner than the second gate oxide film 108 that has been increased in thickness.

Next, as shown in FIG. 4C, first, second, and third gate electrodes 111A, 111B, and 111C are formed on the input/output MOSET active region, the first internal MOSFET active region, and the second internal MOSFET active region with the relatively thickest first gate oxide film 106, the relatively second thickest second gate oxide film 108, and the relatively thinnest third gate oxide film 110 interposed therebetween, respectively. Then, first, second, and third sidewalls 112A, 112B, and 112C are formed on the respective side surfaces of the first, second, and third gate electrodes 111A, 111B, and 111C.

Thereafter, source/drain electrodes, an interlayer insulating film, metal wiring, and the like are formed by using well-known techniques, though they are not depicted, whereby the fabrication of the semiconductor device comprising an input/output circuit composed of the MOSFET having the first gate oxide film 106 and an internal circuit composed of the two MOSFETs having the second and third gate oxide films 108 and 110 is completed.

FIG. 5 is a plan view corresponding to the cross-sectional view in the step shown in FIG. 4C. Briefly, FIG. 4C is a cross-sectional view taken along the line I—I of FIG. 5 and FIG. 6 is a cross-sectional view taken along the line II—II of FIG. 5.

Figure 6:
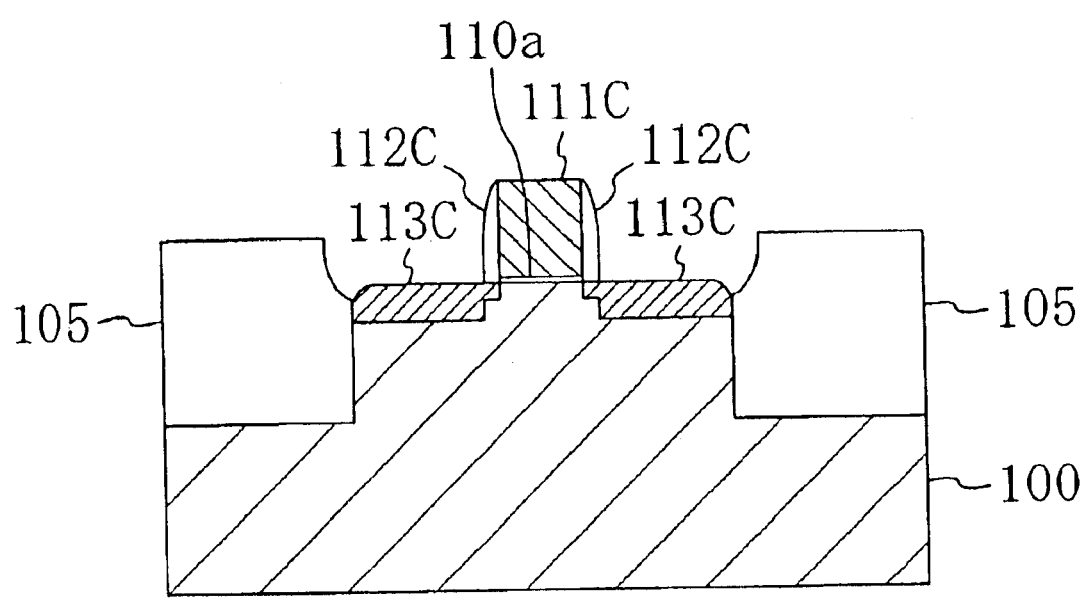
FIG. 6 is a cross-sectional view taken along the line II—II of FIG. 5.

As shown in FIGS. 5 and 6, first, second, and third impurity diffusion layers 113A, 113B, and 113C serving as respective source/drain regions are provided in the input/output MOSFET active region, the first internal MOSFET active region, and the second internal MOSFET active region separated from each other by the trench isolation region 105. It is to be noted that, as shown in FIGS. 4C and 5, each of the gate electrodes 111A, 111B, and 111C is provided to have both end portions overlapping the trench isolation region 105 in the gate width direction. As shown in, e.g., FIG. 6, the portion of the third gate oxide film 110 other than the portion thereof underlying the third gate electrode 111C may also be removed during the formation of the third gate electrode 111C such that a patterned third gate oxide film 110a is formed. Likewise, the first and second gate oxide films 106 and 108 may also be patterned during the formation of the first and second gate electrodes 111A and 111B.

Table 1 shows, for each of the MOSFET active regions, the thickness of the insulating film (the pad oxide film or the gate oxide film) or an amount of wet etching (thickness of an etched film portion) in each of the steps, the number of times that the silicon substrate was exposed by wet etching, and the total amount of wet etching in the method for fabricating a semiconductor device according to the first embodiment.

TABLE 1

| Step | Second Internal MOSFET (Thin-Film Gate Insulating Film) | First Internal MOSFET (Thick-Film Gate Insulating Film) | Input/Output MOSFET |
| --- | --- | --- | --- |
| Thickness of Insulating Film in Step Shown in FIG. 2B | 15 nm | 15 nm | 15 nm |
| Amount of Wet Etching in Step Shown in FIG. 2C | Corresponding to 22.5 nm | Corresponding to 22.5 nm | Corresponding to 22.5 nm |
| Thickness of Insulating Film in Step Shown in FIG. 3A | 7 nm | 7 nm | 7 nm |
| Amount of Wet Etching in Step Shown in FIG. 3B | Corresponding to 0 nm | Corresponding to 10.5 nm | Corresponding to 0 nm |
| Thickness of Insulating Film in Step Shown in FIG. 3C | 7.4 nm | 1.6 nm | 7.4 nm |
| Amount of Wet Etching in Step Shown in FIG. 4A | Corresponding to 11.1 nm | Corresponding to 0 nm | Corresponding to 0 nm |
| Thickness of Insulating Film in Step Shown in FIG. 4B | 1.6 nm | 2.8 nm | 7.8 nm |
| Number of Times That Si Substrate was Exposed by Wet Etching | 2 | 2 | 1 |
| Total Amount of Wet Etching | Corresponding to 33.6 nm | Corresponding to 33.0 nm | Corresponding to 22.5 nm |

In the first embodiment, as shown in Table 1, the substrate surface in the input/output MOSFET active region is exposed once by wet etching in the same manner as in the second conventional embodiment (Amount of Wet Etching: Corresponding to 22.5 nm). On the other hand, the substrate surface in the first internal MOSFET active region on which the thick-film gate insulating film is to be provided is exposed twice by wet etching in the same manner as in the second conventional embodiment (Total Amount of Wet Etching: Corresponding to 33.0 nm). By contrast, the substrate surface in the second internal MOSFET active region on which the thin-film gate insulating film is to be provided is exposed only twice by wet etching, which is smaller in the number of times by one than in the second conventional embodiment (Total Amount of Wet Etching: Corresponding to 33.6 nm). In other words, the number of times that the portion of the silicon oxide film composing the trench isolation region 105 which is adjacent each of the MOSFET active regions is removed by wet etching is once in the input/output MOSFET active region, while it is twice in each of the first and second internal MOSFET active regions. As a result, the total amount of wet etching in the second internal MOSFET active region in the first embodiment is reduced by about 5% than in the second conventional embodiment.

Figure 14A:
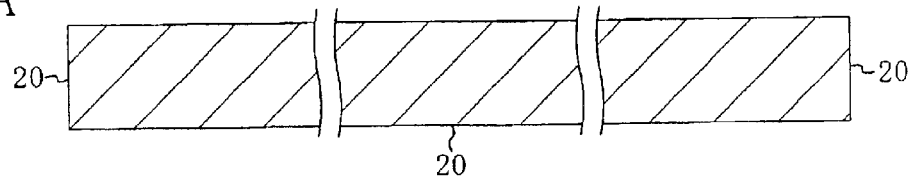
FIGS. 14A to 14C are cross-sectional views illustrating a method for fabricating a semiconductor device according to a second conventional embodiment.
Figure 14B:
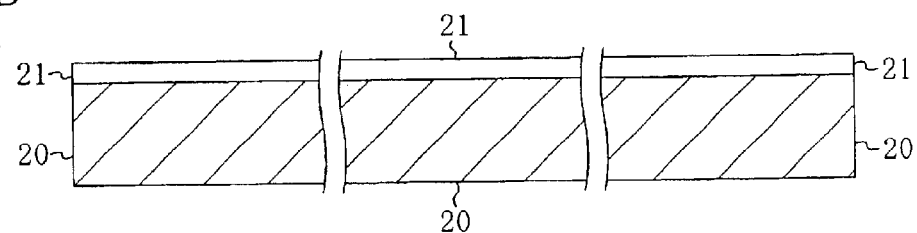
Figure 14C:
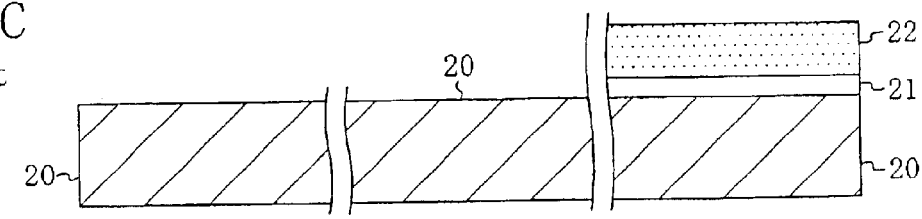
Figure 15A:
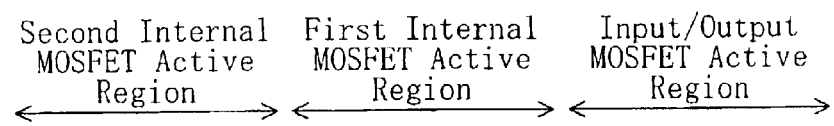
FIGS. 15A to 15C are cross-sectional views illustrating the method for fabricating a semiconductor device according to the second conventional embodiment.
Figure 15B:
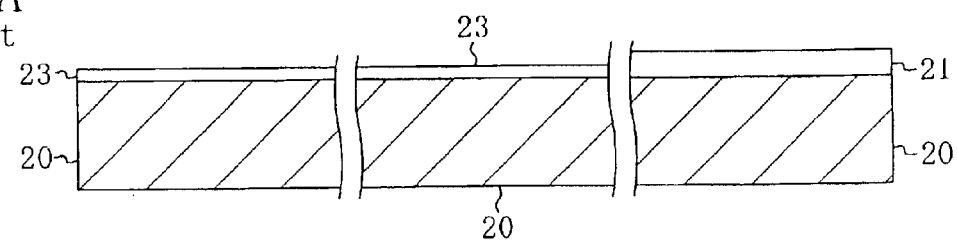
Figure 15C:
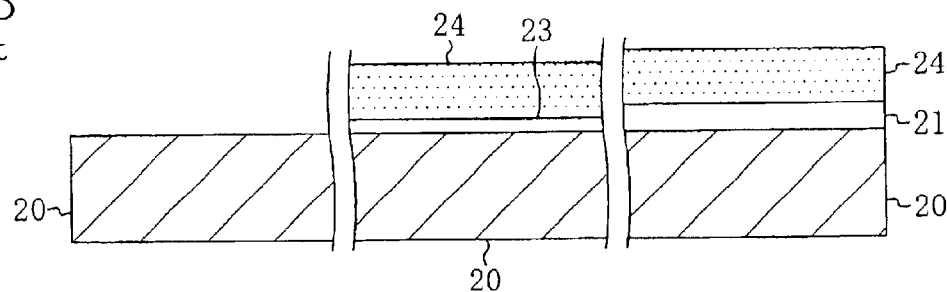
Figure 16:
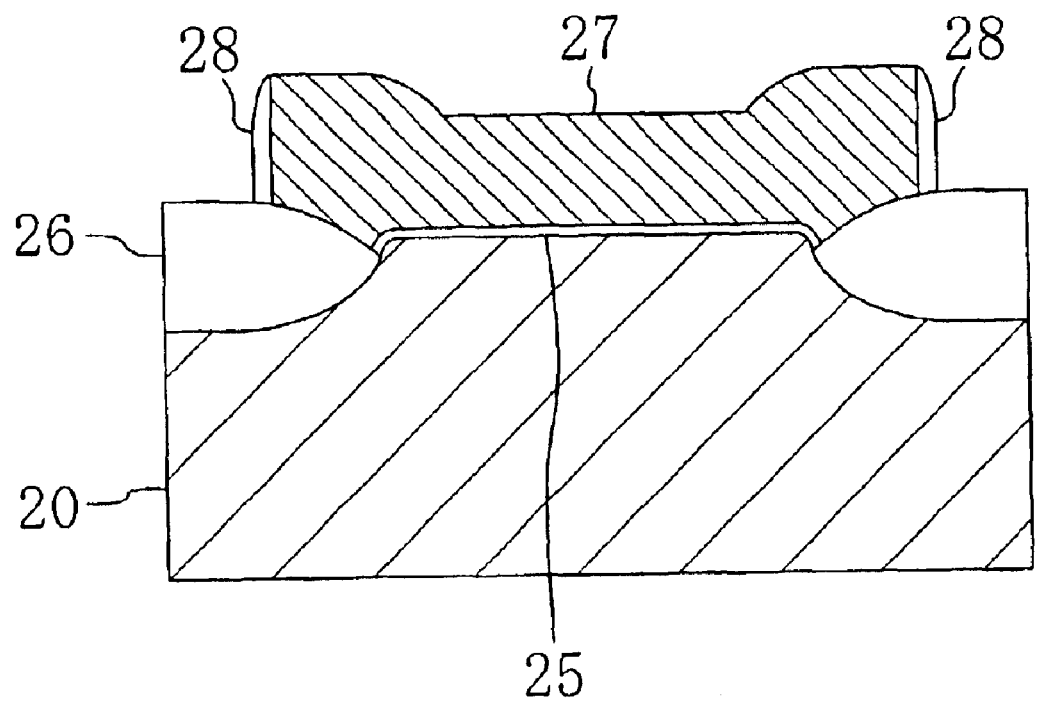
FIG. 16 is a view for illustrating problems associated with the method for fabricating a semiconductor device according to the conventional second embodiment.

As stated previously, the first embodiment forms the relatively thickest first gate oxide film 106 on each of the input/output MOSFET active region, the first internal MOSFET active region, and the second internal MOSFET active region which are separated from each other by the trench isolation region 105. After the first gate oxide film 106 on the first internal MOSFET active region is then removed therefrom, the relatively second thickest second gate oxide film 108 is formed on the first internal MOSFET active region. After the first gate oxide film 106 on the second internal MOSFET active region is then removed therefrom, the relatively thinnest third gate oxide film 110 is formed on the second internal MOSFET active region. In short, the thinner gate oxide films are formed in the steps performed at the later times, while the thickest first gate oxide film 106 is left on the second internal MOSFET active region immediately before the formation of the thinnest third gate oxide film 110 on the second internal MOSFET active region. In contrast to the second conventional embodiment (which forms the first gate oxide film on each of the MOSFET active regions, removes the first gate oxide film on each of the first and second internal MOSFET active regions therefrom, forms the second gate oxide film on each of the first and second internal MOSFET active region, removes the second gate oxide film on the second internal MOSFET active region, and then forms the third gate oxide film on the second internal MOSFET active region (see FIGS. 14 and 15), the following effects are achievable.

Specifically, the number of times that the second internal MOSFET active region is exposed by wet etching or the like performed to remove the gate oxide films can be reduced. This reduces the roughness of the substrate surface in the second internal MOSFET active region. Since the depth to which the region of the exposed portion of the trench isolation region 105 which is adjacent the second internal MOSFET active region, i.e., the end portion of the trench isolation region 105 is etched can be reduced, the thickness of the third gate oxide film 110 becomes uniform and the localization of an electric field to the portion of the third gate oxide film 110 which is adjacent the trench isolation region 105 can be prevented. This prevents anomalies in the characteristics of a transistor or the degradation of the reliability of a gate insulating film resulting from increased roughness of the substrate surface, the uneven thickness of the gate insulating film, or the localization of an electric field. Since the number of times that the second internal MOSFET active region is exposed becomes equal to the number of times that the first internal MOSFET active region is exposed, the setting of a process margin for each of the MOSFETs if a gate voltage of the same magnitude is applied to each of the MOSFETs formed in the first and second internal MOSFET active regions can be performed easily.

Moreover, the first embodiment achieves the effects described above without increasing the number of process steps compared with the second conventional embodiment.

Since the first embodiment has formed each of the first, second, and third gate oxide films 106, 108, and 110 by thermally oxidizing the substrate surfaces in the active regions on which the gate oxide films are to be provided, each of the gate oxide films can be formed easily and reliably.

Further, the first embodiment performs wet etching with respect to the first gate oxide film 106 by using, as a mask, a resist pattern covering an active region other than the specified active region in the step (step shown in FIG. 3B or FIG. 4A) of removing the first gate oxide film 106 on the specified active region therefrom. This ensures the removal of the first gate oxide film 106 on the specified active region, while protecting the surface (if the gate oxide film is formed, the surface thereof) of the other active region.

Although the first embodiment has formed one type of input/output MOSFET having one type of gate insulating film and two types of internal MOSFETs having two types of gate insulating films as three types of MOSFETs having three types of gate insulating films of different thicknesses, the object or usage of the three types of MOSFETs is not particularly limited. It will easily be understood that the thicknesses of the three types of gate insulating films are not particularly limited except for the relative magnitudes thereof. It is also possible to form two types of input/output MOSFETs having two types of gate insulating films and one type of internal MOSFET having one type of gate insulating film as three types of MOSFETs. Specifically, it is possible to form the thinnest gate insulating film (with a thickness of, e.g., 1.6 nm) on the internal MOSFET active region, the second thickest gate insulating film (with a thickness of, e.g., 3.6 nm) on the first input/output MOSFET active region, and the thickest gate insulating film (with a thickness of, e.g., 7.8 nm) on the second input/output MOSFET active region). In this case, the second input/output MOSFET active region, the first input/output MOSFET active region, and the internal MOSFET active region correspond to "a first active region", "a second active region", and "a third active region" recited in appended claims.

Although the first embodiment has formed the gate oxide films each composed of $SiO_2$ on the individual active regions by performing a heat treatment with respect to the silicon substrate 100 in an oxidizing atmosphere, a gate insulating film composed of $SiON$ may also be formed instead on each of the active regions by performing a heat treatment with respect to the silicon substrate 100 in an oxynitriding atmosphere.

Although the first embodiment has formed the trench isolation region 105 as an isolation region in the silicon substrate 100, the same effects are achievable even if an isolation region is formed in the silicon substrate 100 by, e.g., LOCOS.

Embodiment 2

Referring to the drawings, a description will be given to a method for fabricating a semiconductor device according to a second embodiment of the present invention, specifically a method for fabricating a MOS semiconductor device having three types of gate insulating films of different thicknesses.

FIGS. 7A to 7C, FIGS. 8A to 8C, FIGS. 9A to 9C, and FIGS. 10A to 10C are cross-sectional views illustrating the individual process steps of the method for fabricating a semiconductor device according to the second embodiment.

First, as shown in FIG. 7A, a pad oxide film 201 having a thickness of about 15 nm and a mask nitride film 202 having a thickness of about 120 nm are formed successively on a silicon substrate 200.

Then, as shown in FIG. 7B, an isolation trench 203 is formed by successively performing dry etching with respect to the mask nitride film 202, the pad oxide film 201, and the silicon substrate 200 by using a mask pattern (not shown) covering the respective portions of the silicon substrate 200 serving as an input/output MOSFET active region, as a first internal MOSFET active region to be provided with a thick-film gate insulating film, and as a second internal MOSFET active region to be provided with a thin-film gate insulating film, i.e., a mask pattern having openings over an isolation formation region. As a result, the silicon substrate 200 is formed with the input/output MOSFET active region, with the first internal MOSFET active region, and with the second internal MOSFET active region isolated from each other by the isolation trench 203 and each covered with the pad oxide film 201.

Figure 8A:
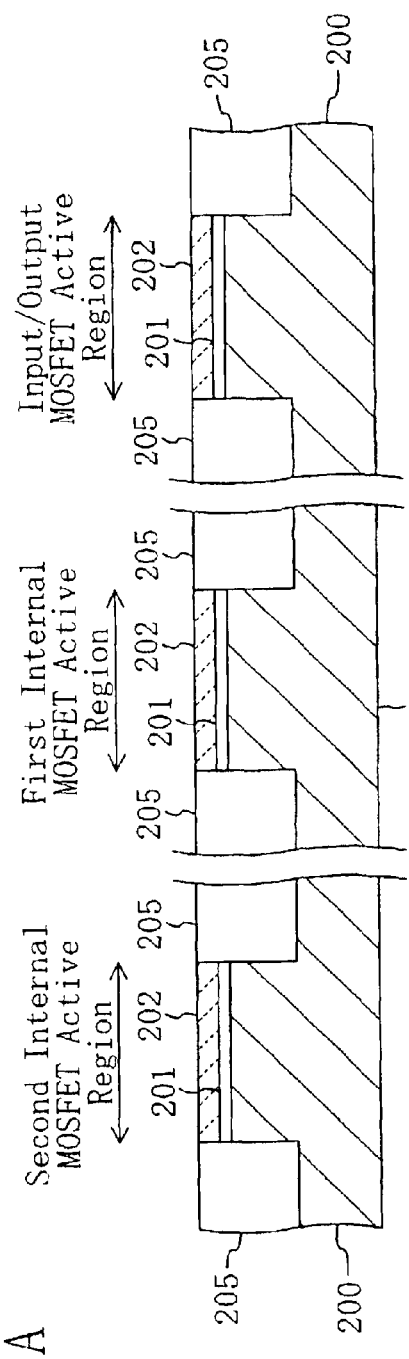
FIGS. 8A to 8C are cross-sectional views illustrating the method for fabricating a semiconductor device according to the second embodiment.
Figure 8B:
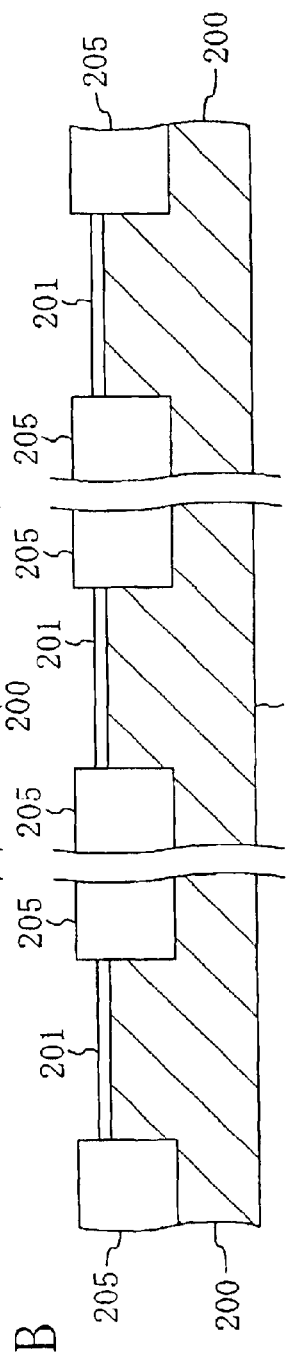

Next, as shown in FIG. 7C, a silicon dioxide film 204 is deposited over the entire surface of the silicon substrate 200 to completely fill up the isolation trench 203. Then, as shown in FIG. 8A, the silicon dioxide film 204 on the mask nitride film 202 is removed therefrom by CMP or the like, whereby a trench isolation region 205 composed of the silicon dioxide film 204 filled in the isolation trenches 203 is formed, while the mask nitride film 202 on each of the MOSFET active regions is exposed. Then, as shown in FIG. 8B, the mask nitride film 202 is removed by wet etching or dry etching so that the pad oxide film 201 is exposed.

Figure 8C:
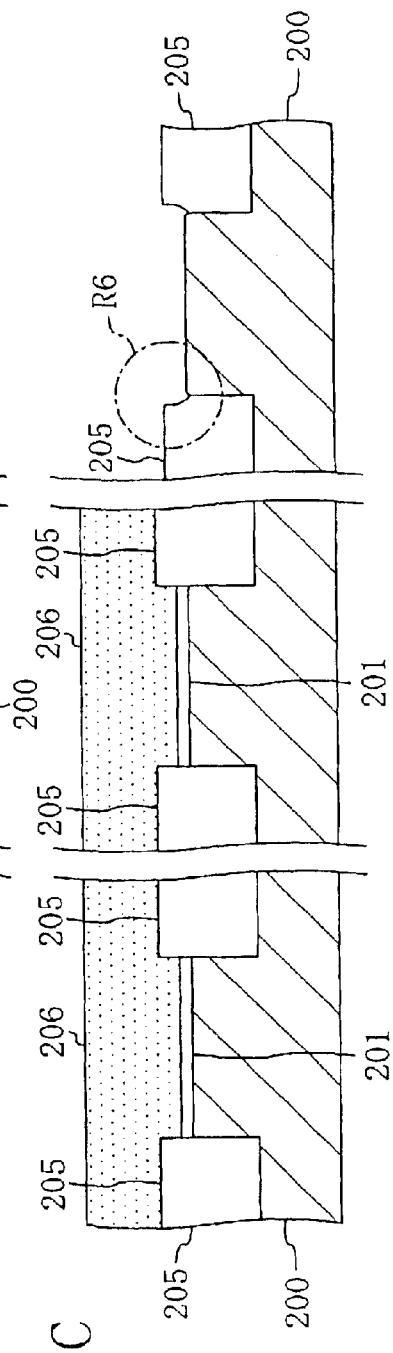

Next, as shown in FIG. 8C, wet etching using a solution containing a hydrofluoric acid is performed with respect to the pad oxide film 201 by using a first resist pattern 206 covering the first and second internal MOSFET active regions as a mask, thereby removing only the pad oxide film 201 on the input/output MOSFET active region therefrom. As a result, only the substrate surface in the input/output MOSFET active region is exposed. At the same time, the region of the exposed portion of the trench isolation region 205 which is adjacent the input/output MOSFET active region is also removed by wet etching (see the region R6).

In the wet etching step shown in FIG. 8C, over-etching of about 50% (corresponding to the thickness of the etched film portion: 22.5 nm) is performed to ensure the removal of the pad oxide film 201 on the input/output MOSFET active region.

After the first resist pattern 206 is then removed, a heat treatment is performed in an oxidizing atmosphere with respect to the silicon substrate 200, as shown in FIG. 9A. This thermally oxidizes the substrate surface in the input/output MOSFET active region with the pad oxide film 210 being formed on each of the first and second internal MOSFET active regions and allows a first gate oxide film 207 having a thickness of, e.g., about 7 nm to be formed on the input/output MOSFET active region. On the other hand, the pad oxide film 201 is increased in thickness to, e.g., about 17 nm.

Next, as shown in FIG. 9B, wet etching using a solution containing hydrofluoric acid is performed with respect to the pad oxide film 201 by using, as a mask, a second resist pattern 208 covering the input/output MOSFET active region and the second internal MOSFET active region, thereby removing only the pad oxide film 201 on the first internal MOSFET active region therefrom and exposing only the substrate surface in the first internal MOSFET active region. At the same time, the region of the exposed portion of the trench isolation region 205 which is adjacent the first internal MOSFET active region is further removed by wet etching (see the region R7).

In the wet etching step shown in FIG. 9B, over-etching of about 50% (corresponding to the thickness of the etched film portion: 25.5 nm) is performed to ensure the removal of the pad oxide film 201 on the first internal MOSFET active region.

After the second resist pattern 208 is then removed, a heat treatment is performed in an oxidizing atmosphere with respect to the silicon substrate 200, as shown in FIG. 9C. This thermally oxidizes the substrate surface in the first internal MOSFET active region with the first gate oxide film 207 being formed on the input/output MOSFET active region and with the pad oxide film 201 being formed on the second internal MOSFET active region and thereby allows a second gate oxide film 209 having a thickness of, e.g., about 1.0 nm to be formed on the first internal MOSFET active region. On the other hand, the heat treatment increases the thickness of the first gate oxide film 207 to, e.g., about 7.2 nm (while the thickness of the pad oxide film 201 is hardly increased). Accordingly, the second gate oxide film 209 is thinner than the first gate oxide film 207 that has been increased in thickness.

Next, as shown in FIG. 10A, wet etching using a solution containing a hydrofluoric acid is performed with respect to the pad oxide film 201 by using, as a mask, a third resist pattern 210 covering the input/output MOSFET active region and the first internal MOSFET active region, thereby removing only the pad oxide film 201 on the second internal MOSFET active region therefrom and exposing only the substrate surface in the second internal MOSFET active region. At the same time, the region of the exposed portion of the trench isolation region 205 which is adjacent the second internal MOSFET active region is removed by wet etching (see the region R8).

In the wet etching step shown in FIG. 10A, over-etching of about 50% (corresponding to the thickness of the etched film portion: 25.5 nm) is performed to ensure the removal of the pad oxide film 201 on the second internal MOSFET active region.

After the third resist pattern 210 is then removed, a heat treatment is performed in an oxidizing atmosphere with respect to the silicon substrate 200, as shown in FIG. 10B. This thermally oxidizes the substrate surface in the second internal MOSFET active region with the first gate oxide film 207 being formed on the input/output MOSET active region and with the second gate oxide film 209 being formed on the first internal MOSFET active region and thereby allows a third gate oxide film 211 having a thickness of, e.g., about 1.6 nm to be formed on the second internal MOSFET active region. On the other hand, the heat treatment increases the thickness of the first gate oxide film 207 to, e.g., about 7.5 nm, while increasing the thickness of the second gate oxide film 209 to, e.g., about 2.4 nm. Accordingly, the third gate oxide film 211 is thinner than the second gate oxide film 209 that has been increased in thickness.

Next, as shown in FIG. 10C, first, second, and third gate electrodes 212A, 212B, and 212C are formed on the input/output MOSET active region, the first internal MOSFET active region, and the second internal MOSFET active region with the relatively thickest first gate oxide film 207, the relatively second thickest second gate oxide film 209, and the relatively thinnest third gate oxide film 211 interposed therebetween, respectively. Then, first, second, and third sidewalls 213A, 213B, and 213C are formed on the respective side surfaces of the first, second, and third gate electrodes 212A, 212B, and 212C.

Thereafter, source/drain electrodes, an interlayer insulating film, metal wiring, and the like are formed by using well-known techniques, though they are not depicted, whereby the fabrication of the semiconductor device comprising an input/output circuit composed of the MOSFET having the first gate oxide film 207 and an internal circuit composed of the two MOSFETs having the second and third gate oxide films 209 and 211 is completed.

FIG. 11 is a plan view corresponding to the cross-sectional view in the step shown in FIG. 10C. Briefly, FIG. 10C is a cross-sectional view taken along the line III—III of FIG. 5 and FIG. 12 is a cross-sectional view taken along the line IV–IV of FIG. 11.

Figure 12:
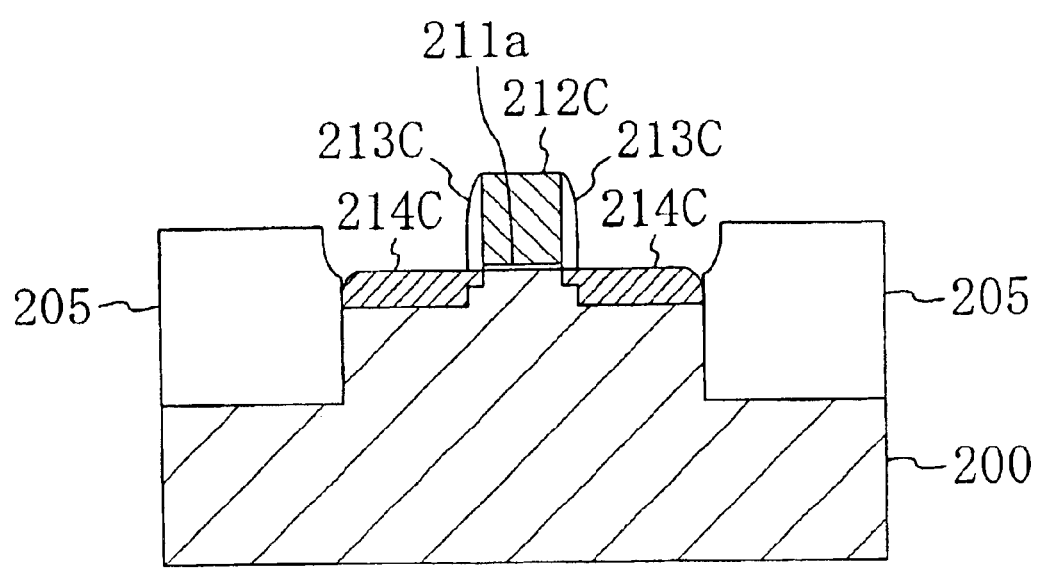
FIG. 12 is a cross-sectional view taken along the line IV—IV of FIG. 11.
Figure 13A:
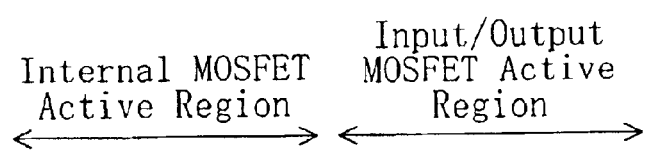
FIGS. 13A to 13C are cross-sectional views illustrating a method for fabricating a semiconductor device according to a first conventional embodiment.
Figure 13B:
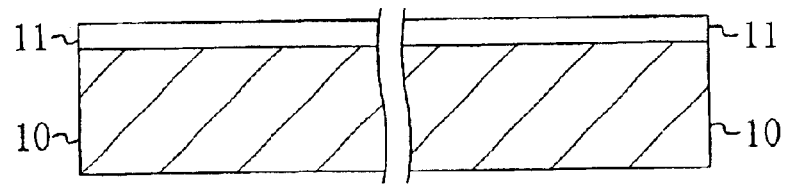
Figure 13C:
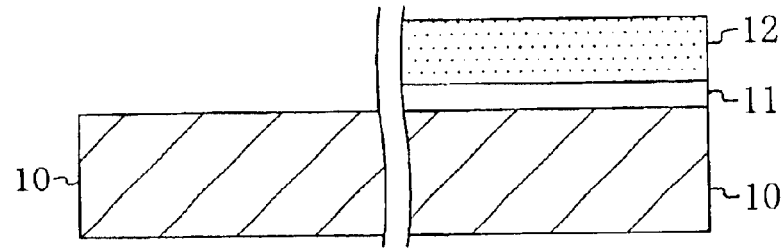

As shown in FIGS. 11 and 12, first, second, and third impurity diffusion layers 214A, 214B, and 214C serving as respective source/drain regions are provided in the input/output MOSFET active region, the first internal MOSFET active region, and the second internal MOSFET active region separated from each other by the trench isolation region 205. It is to be noted that, as shown in FIGS. 10C and 11, each of the gate electrodes 212A, 212B, and 212C is provided to have both end portions overlapping the trench isolation region 205 in the gate width direction. As shown in, e.g., FIG. 12, the portion of the third gate oxide film 211 other than the portion thereof underlying the third gate electrode 212C may also be removed during the formation of the third gate electrode 212C such that a patterned third gate oxide film 211a is formed. Likewise, the first and second gate oxide films 207 and 209 may also be patterned during the formation of the first and second gate electrodes 212A and 212B.

Table 2 shows, for each of the MOSFET active regions, the thickness of the insulating film (the pad oxide film or the gate oxide film) or an amount of wet etching (thickness of an etched film portion) in each of the steps, the number of times that the silicon substrate was exposed by wet etching, and the total amount of wet etching in the method for fabricating a semiconductor device according to the second embodiment.

TABLE 2

| Step | Second Internal MOSFET (Thin-Film Gate Insulating Film) | First Internal MOSFET (Thick-Film Gate Insulating Film) | Input/Output MOSFET |
|---|---|---|---|
| Thickness of Insulating Film in Step Shown in FIG. 8B | 15 nm | 15 nm | 15 nm |
| Amount of Wet Etching in Step Shown in FIG. 8C | Corresponding to 0 nm | Corresponding to 0 nm | Corresponding to 22.5 nm |
| Thickness of Insulating Film in Step Shown in FIG. 9A | 17 nm | 17 nm | 7 nm |
| Amount of Wet Etching in Step Shown in FIG. 9B | Corresponding to 0 nm | Corresponding to 25.5 nm | Corresponding to 0 nm |
| Thickness of Insulating Film in Step Shown in FIG. 9C | 17 nm | 1.0 nm | 7.2 nm |
| Amount of Wet Etching in Step Shown in FIG. 10A | Corresponding to 25.5 nm | Corresponding to 0 nm | Corresponding to 0 nm |
| Thickness of Insulating Film in Step Shown in FIG. 10B | 1.6 nm | 2.4 nm | 7.5 nm |
| Number of Times That Si Substrate was Exposed by Wet Etching | 1 | 1 | 1 |
| Total Amount of Wet Etching | Corresponding to 25.5 nm | Corresponding to 25.5 nm | Corresponding to 22.5 nm |

In the second embodiment, as shown in Table 2, the substrate surface in the input/output MOSFET active region is exposed once by wet etching in the same manner as in the second conventional embodiment (Amount of Wet Etching: Corresponding to 22.5 nm). On the other hand, the substrate surface in the first internal MOSFET active region on which the thick-film gate insulating film is to be provided is exposed only once by wet etching, which is smaller in the number of times by one than in the second conventional embodiment (Total Amount of Wet Etching: Corresponding to 25.5 nm). The substrate surface in the second internal MOSFET active region on which the thin-film gate insulating film is to be provided is also exposed only once by wet etching, which is smaller in the number of times by two than in the second conventional embodiment (Total Amount of Wet Etching: Corresponding to 25.5 nm). In other words, the number of times that the portion of the silicon oxide film composing the trench isolation region 205 which is adjacent each of the MOSFET active regions is removed by wet etching is once in each of the input/output MOSFET active region and the first and second internal MOSFET active regions. As a result, the total amount of wet etching in the first and second internal MOSFET active regions in the second embodiment is reduced significantly compared with the second conventional embodiment.

As stated previously, the second embodiment removes that one of the pad oxide films 201 covering the respective MOSFET active regions separated from each other by the trench isolation region 205 which is on the input/output MOSFET active region therefrom and forms the relatively thickest first gate oxide film 207 on the input/output MOSFET active region. After the pad oxide film 201 on the first internal MOSFET active region is then removed therefrom, the relatively second thickest second gate oxide film 209 is formed on the first internal MOSFET active region. After the pad oxide film 201 on the second internal MOSFET active region is then removed therefrom, the relatively thinnest third gate oxide film 211 is formed on the second internal MOSFET active region. In short, the thinner gate oxide films are formed in the steps performed at the later times, while the pad oxide film 201 is left on each of the first and second internal MOSFET active regions immediately before the formation of the second and third gate oxide films 209 and 211 on the first and second internal MOSFET active regions. Accordingly, the second embodiment can achieve the following effects in contrast to the second conventional embodiment.

Specifically, the number of times that the first and second internal MOSFET active regions are exposed by wet etching or the like performed to remove the pad oxide film or the gate oxide films can be reduced. This reduces the roughness of the substrate surface in each of the first and second internal MOSFET active regions. Since the depth to which each of the regions of the exposed portions of the trench isolation region 205 which are adjacent the first and second internal MOSFET active regions can be reduced, the thickness of each of the second and third gate oxide films 209 and 211 becomes uniform and the localization of an electric field to the portion of each of the second and third gate oxide films 209 and 211 which is adjacent the trench isolation region 205 can be prevented. This prevents anomalies in the characteristics of a transistor or the degradation of the reliability of a gate insulating film resulting from increased roughness of the substrate surface, an uneven thickness of the gate insulating film, or the localization of an electric field. Since the number of times that the second internal MOSFET active region is exposed becomes equal to the number of times that the first internal MOSFET active region is exposed, the setting of a process margin for each of the MOSFETs if a gate voltage of the same magnitude is applied to each of the MOSFETs formed in the first and second internal MOSFET active regions can be performed easily.

Since the second embodiment has formed each of the first, second, and third gate oxide films 207, 209, and 211 by thermally oxidizing the substrate surfaces in the active regions on which the individual gate oxide films are to be provided, each of the gate oxide films can be formed easily and reliably.

Further, the second embodiment performs wet etching with respect to the pad oxide film 201 by using, as a mask, a resist pattern covering an active region other than the specified active region in the step (step shown in FIG. 8C, FIG. 9B, or FIG. 10A) of removing the pad oxide film 201 on the specified active region therefrom. This ensures the removal of the pad oxide film 201 on the specified active region therefrom, while protecting the surface (if the gate oxide film is formed, the surface thereof) of the other active region.

Although the second embodiment has formed one type of input/output MOSFET having one type of gate insulating film and two types of internal MOSFETs having two types of gate insulating films as three types of MOSFETs having three types of gate insulating films of different thicknesses, the object or usage of the three types of MOSFETs is not particularly limited. It will easily be understood that the thicknesses of the three types of gate insulating films are not particularly limited except for the relative magnitudes thereof. It is also possible to form two input/output MOSFETs having two types of gate insulating films and one type of internal MOSFET having one type of gate insulating film as three types of MOSFETs. Specifically, it is possible to form the thinnest gate insulating film (with a thickness of, e.g., 1.6 nm) on the internal MOSFET active region, the second thickest gate insulating film (with a thickness of, e.g., 3.6 nm) on the first input/output MOSFET active region, and the thickest gate insulating film (with a thickness of, e.g., 7.8 nm) on the second input/output MOSFET active region.

Although the second embodiment has formed the gate oxide films each composed of $SiO_2$ on the individual active regions by performing a heat treatment with respect to the silicon substrate 200 in an oxidizing atmosphere, a gate insulating film composed of SiON may also be formed instead on each of the active regions by performing a heat treatment with respect to the silicon substrate 200 in an oxynitriding atmosphere.

Although the second embodiment has formed the trench isolation region 205 as an isolation region in the silicon substrate 200, the same effects are achievable even if an isolation region is formed in the silicon substrate 200 by, e.g., LOCOS.

What is claimed is:

1. A method for fabricating a semiconductor device, the method comprising the steps of:
    a) forming a semiconductor substrate with a first active region, a second active region, and a third active region isolated from each other by an isolation region;
    b) after the step a), forming a first gate insulating film on the first active region, second active region, and third active region;
    c) selectively removing the first gate insulating film on the second active region therefrom, such that the first gate insulating film on the first active region and the first gate insulating film on the third active region are not removed;
    d) after the step c), forming a second gate insulating film thinner than the first gate insulating film on the second active region;
    e) after the step d), selectively removing the first gate insulating film on the third active region therefrom, such that the first gate insulating film on the first active region and the second gate insulating film on the second active region are not removed;
    f) after the step e), forming a third gate insulating film thinner than the second gate insulating film on the third active region; and
    g) forming a first gate electrode, a second gate electrode, and a third gate electrode on the first active region, second active region, and third active region with the first gate insulating film, second gate insulating film, and third gate insulating film interposed therebetween, respectively.

2. The method of claim 1, wherein the isolation region is a trench isolation region.

3. The method of claim 1, wherein the step b) includes the step of thermally oxidizing a surface of each of the first, second, and third active regions.

4. The method of claim 1, wherein the step c) includes the step of performing wet etching with respect to the first gate insulating film by using a resist pattern covering the first active region and third active region as a mask.

5. The method of claim 1, wherein the step d) includes the step of thermally oxidizing a surface of the second active region.

6. The method of claim 1, wherein the step e) includes the step of performing wet etching with respect to the first gate insulating film by using a resist pattern covering the first active region and second active region as a mask.

7. The method of claim 1, wherein the step f) includes the step of thermally oxidizing a surface of the third active region.

8. A method for fabricating a semiconductor device, the method comprising the steps of:
- a) forming a semiconductor substrate with a first active region, a second active region, and a third active region separated from each other by an isolation region and each having a surface covered with a pad oxide film;
- b) selectively removing the pad oxide film on the first active region therefrom, such that the pad oxide film on the second active region and the pad oxide film on the third active region are not removed;
- c) after the step b), forming a first gate insulating film on the first active region;
- d) after the step c), selectively removing the pad oxide film on the second active region therefrom, such that the first sate insulating film on the first active region and the pad oxide film on the third active region are not removed;
- e) after the step d), forming a second gate insulating film thinner than the first gate insulating film on the second active region;
- f) after the step e), selectively removing the pad oxide film on the third active region therefrom, such that the first gate insulating film on the first active region and the second gate insulating film on the second active region are not removed;
- g) after the step f), forming a third gate insulating film thinner than the second gate insulating film on the third active region; and
- h) forming a first gate electrode, a second gate electrode, and a third gate electrode on the first active region, second active region, and third active region with the first gate insulating film, second gate insulating film, and third gate insulating film interposed therebetween, respectively.

9. The method of claim 8, wherein the isolation region is a trench isolation region.

10. The method of claim 8, wherein each of the first active region and second active region is an active region of a MOSFET of an input/output circuit and the third active region is an active region of a MOSFET of an internal circuit.

11. The method of claim 8, wherein the step b) includes the step of performing wet etching with respect to the pad oxide film on the first active region by using a resist pattern covering the second active region and third active region as a mask.

12. The method of claim 8, wherein the step c) includes the step of thermally oxidizing a surface of the first active region.

13. The method of claim 8, wherein the step d) includes the step of performing wet etching with respect to the pad oxide film on the second active region by using a resist pattern covering the first active region and third active region as a mask.

14. The method of claim 8, wherein the step e) includes the step of thermally oxidizing a surface of the second active region.

15. The method of claim 8, wherein the step f) includes the step of performing wet etching with respect to the pad oxide film on the third active region by using a resist pattern covering the first active region and second active region as a mask.

16. The method of claim 8, wherein the step g) includes the step of thermally oxidizing a surface of the third active region.

* * * * *